United States Patent

Engelko et al.

[11] Patent Number: 5,841,235
[45] Date of Patent: Nov. 24, 1998

[54] SOURCE FOR THE GENERATION OF LARGE AREA PULSED ION AND ELECTRON BEAMS

[75] Inventors: Vladimir Engelko, Petersburg, Russian Federation; Harald Giese, Stutensee, Germany; Georg Müller; Sven Schalk, both of Karlsruhe, Germany; Christoph Schultheiss, Berghausen, Germany; Hermann Würz, Bietigheim, Germany

[73] Assignee: Forschungszentrum Karlsruhe GmbH, Karlsruhe, Germany

[21] Appl. No.: 866,551

[22] Filed: May 30, 1997

[51] Int. Cl.⁶ .................................................. H01J 37/00
[52] U.S. Cl. .............................. 315/111.21; 315/111.31; 315/111.81
[58] Field of Search .................... 315/111.21, 111.31, 315/111.41, 111.61, 111.71, 111.81, 111.51; 313/359.1, 362.1, 363.1

[56] References Cited

U.S. PATENT DOCUMENTS 4,786,844  11/1988  Farrell et al. ...................... 315/111.21

*Primary Examiner*—Don Wong
*Assistant Examiner*—David H. Vu
*Attorney, Agent, or Firm*—Klaus J. Bach

[57] ABSTRACT

In a source for the generation of large-area pulsed ion or electron beams from an anode discharge electrode which has openings receiving discharge electrodes forming a vacuum arc plasma source, the discharge is safely triggered by a load which determines the total current and which consists of a parallel circuit including an ohmic resistor and a capacitor wherein the load output is adapted to the internal resistance of the pulse voltage generator. With a dimensioning of the electrical components taking into consideration given limits, a homogeneous beam of charged particles is obtained wherein the particle composition can be all the same or a homogeneous mixture of different particles depending on the choice of electrode materials.

6 Claims, 1 Drawing Sheet

SOURCE FOR THE GENERATION OF LARGE AREA PULSED ION AND ELECTRON BEAMS

BACKGROUND OF THE INVENTION

The invention relates to a source for the generation of large area pulsed ion and electron beams including an arc plasma source disposed in a vacuum chamber and having an expansion space and an extraction system.

Such a pulsed radiation beam source is utilized in the manufacture of semiconductors for the ion implantation and also in the metal processing industry in the area of surface treatment. Furthermore, the effects of the irradiation of material surfaces with various types of ions is subject to intensive research in many special laboratories. Research performed in these laboratories indicates that, by irradiation with a selection of suitable types of ions, the wear and corrosion resistance of metal surfaces can be significantly improved.

Although ion sources have found widespread application in the area of semiconductor manufacturing, they are not being extensively used in other industrial manufacturing areas where a well controlled foreign material implantation is important for the improvement of material properties.

In comparison with electroplating bathes for the surface treatment for example, ion sources have some important disadvantages such as:

ion sources are very complex in their structure and operation in most cases ion sources do not provide for large area material treatment.

The basic design and operation of such pulsed radiation sources are described and explained for example in an article "METAL VAPOR VACUUM ARC SOURCE", by I.G. Brown et al., in Rev. Sci. Instrum. 57(6), Inc. 1986, pages 1069 to 1084. This type of radiation source generates the plasma from which the desired ions are to be extracted by arc discharge in a vacuum.

The source comprises, in principle, three components arranged in a vacuum chamber (see FIGS. 1 and 4 of the article) that is, a vacuum arc plasma source, an expansion space and an extraction system.

The arc plasma source includes three co-axial electrodes: an anode, a cathode and a trigger electrode. The arc discharge is triggered by a spark discharge between the cathode and the trigger electrode. The trigger impulse of several microseconds and a voltage amplitude of 10–20 kV needed herefor is generated by a capacitor discharge, wherein the capacitor is placed, by way of a thyrotron switch and an isolation transformer, between the cathode and the trigger electrode.

The voltage source required for the arc discharge is a pulse voltage source (pulse forming line) raised to the level of the extraction voltage.

After the discharge is triggered, part of the plasma cloud generated by the arc discharge between the anode and the cathode flows through the central opening in the anode toward the ion extractor.

The extractor system comprises an arrangement of three grids. The first grid, that is the grid disposed closest to the anode, is connected to the anode by way of a resistor; the second grid is biased by a potential of –1 kV. The third grid is at ground potential. The ion acceleration voltage is applied between the first two grids.

However, this type of sources have the following weaknesses:

a) a small beam diameter of only a few centimeters and, as a result, a relatively low ion flow.

b) the need for a trigger unit for triggering the vacuum arc discharge requiring a high voltage supply and a high voltage transformer.

c) the need for a voltage supply for the vacuum arc discharge corresponding about to the extraction voltage.

d) the need for a synchronization between the initiation of the arc discharge and the application of the extraction voltage (as long as the extraction voltage is not applied, the arc plasma must not advance to the extraction area).

e) the ion beam generated consists of only one type of ions which is determined by the cathode material of the arc discharge gap.

f) the radial current density distribution is inhomogeneous (typical Gauss-profile) because the plasma is radially inhomogeneous as a result of recombination effects at the surrounding walls.

The beam diameter of Brown-type sources can be increased by a matrix-like arrangement of a plurality of such sources. With different cathode materials for the various sources such an arrangement would also provide for the generation of a mixed ion beam. However, the disadvantages b), c), d), f) would still remain.

It is the object of the present invention to provide an ion beam source which, with a view to the surface treatment of materials, generates a highly homogeneous large-area beam of electrically charged particles.

SUMMARY OF THE INVENTION

In a source for the generation of large-area pulsed ion or electron beams from an anode discharge electrode which has openings receiving discharge electrodes forming a vacuum arc plasma source, the discharge is safely triggered by a load which determines the total current and which consists of a parallel circuit including an ohmic resistor and a capacitor wherein the load output is adapted to the internal resistance of the pulse voltage generator. With a dimensioning of the electrical components taking into consideration given limits, a homogeneous beam of charged particles is obtained wherein the particle composition can be all the same or a homogeneous mixture of different particles depending on the choice of electrode materials.

It has been recognized that, in the anode arrangement the beam current is increased by about 50% by the installation of the resistor $R_{AG}$ between the anode grid AG and the anode discharge electrode DE. The resistance of the resistor $R_{AG}$ must fulfill the following requirement $$R_{AG} \gg Te/e\, I_{io}\, (1-\alpha)$$

wherein Te is the electron temperature in the plasma, e=the electron elementary charge and $I_{io}$ is the electron saturation current which is calculated in the following manner;

$$I_{io} = 0.49\, e\, n_i\, A(Te/m_i)^{1/2};$$

wherein $n_i$ is the ion particle density, $m_i$ is the ion mass and A is the anode grid area. $\alpha$ is the anode grid transparency. (The factor 0.49 is taken from the plasma theory.) Under these conditions the anode grid AG can assume the floating potential of the anode plasma.

In order to prevent during the triggering phase an essential drop of the anode voltage by way of the anode external resistor $R_A$, this resistor is bridged by the capacitor $C_A$. The capacitance of the capacitor is so selected that it is fully charged only when the tripping process is completed. It is between the limits:

$$T/[(R_A+R_\Pi])/R_A R_\Pi] \gg C_A \gg T/[(R_A+R_\Pi)/R_A R_\Pi]$$

Herein T is the time period required for the development of the arc discharge or, respectively, the surface discharge between the wire electrodes NE and the anode discharge electrode DE. T is the duration of the high voltage impulse. The total wire electrode resistance is:

$$R_\Pi = R_o/n$$

wherein n is the total number of wire electrodes.

The discharge current $i_{disc}$ flowing through the parallel wire electrodes NE is, in a built-up state, equal to the quotient $U/R_A$ of the applied high voltage U and the external resistor $R_A$. Many of the series resistors $R_D$ which, during discharge, are switched parallel—in order obtain beams which are homogeneous over the beam cross-sections many (n) wire electrodes NE and correspondingly many series resistors $R_o$ are required—are negligible with regard to $R_A$. Accordingly, they can be neglected for dimensioning.

It is consequently easily possible to control, by the selection of $R_A$ for a fully triggered or, respectively, built up state, the discharge current $i_{disc}$ and, consequently the generation rate for the anode plasma and, as a result, the ion flux $i_i$ which is supplied by the source and which is proportional to the discharge current $i_{disch}$. Since, as it is common for this type of sources, the ion flux $i_i$ supplied by the source is only about 5% of the discharge current $i_{disch}$ the latter determines essentially the total current requirements of the source. This implies that $R_A$ represents the main load for the pulse generator PVG feeding the source. A tuning of the generator resistance $R_i$ of the pulse generator $R_A$ permits, in a simple manner, a voltage-independent adaptation of the output between the source and the energy supply.

In order to prevent the resistors $R_o$ from being subjected to metal vapor deposits whereby they would be short-circuited after some extended operation, they are shielded from the area of the wire electrodes NE by a dielectric plate P.

In order to obtain a beam cross-section with homogeneously distributed ions, many (n) wire electrodes must be provided. However, in order to provide different ions the wire electrodes consist of the respective materials. By an appropriate arrangement of the wire electrodes of different materials, either an ion flow can be generated in which the various ion types are homogeneously distributed if the wire electrodes NE of the various materials are homogeneously distributed or the distribution of the various ion types in the ion flow can be adjusted as desired by the respective distribution of the wire electrodes of the particular materials.

As electrode a so-called Pierce electrode may be utilized which suppresses a lateral acceleration of the charge carrier at the ends of the acceleration area between the anode grid AG and the cathode grid CG1.

The first cathode grid CG1 at the end of the acceleration space is provided at the circumference with a focusing electrode CFE for optimal guidance of the beam.

A subsequent cathode grid CG2 arranged in the beam path consists of a material with a high emission coefficient for secondary electrons.

All penetrations to the various electrodes and to the current collection rail are high voltage resistant so that the potentials applied can be varied in level and sense as desired.

Openings in the anode discharge grid DE through which the respective wire electrodes NE extend are closed by a dielectric material which has a high hydrogen content so that, depending on the potential applied, a proton or electron beam is generated.

The beam source has the following advantages:

the use of only one voltage source for the generation of the ion- or electron-emitting plasma and for the acceleration thereof. This results in an automatic synchronization of the plasma build-up and the occurrence of the acceleration voltage. This is one of the special advantages of the invention over other ion sources available today. Today's ion sources require, as described above on the basis of the Brown ion source, special devices for initiating and maintaining the plasma generation and for the synchronization of the various processes.

Large beam cross-sections up to square meters.

Beam homogenity over the whole beam cross-section which can be easily optimized by a corresponding number of plasma sources per area and its series resistors $R_o$.

Simple control of the ion or electron flux density.

High efficiency of the space charge neutralization of the ion beam in the drift area results in little beam widening.

Independence of the internal resistance of the source of the voltage applied facilitates the output adaptation of the source to the energy supply.

Beams of hydrogen-carbon and various metal ions can be generated as well as electron beams. Furthermore, the various ions can be combined in a single beam.

The invention will be described in greater detail below on the basis of a schematic drawing representation.

DESCRIPTION OF A PREFERRED EMBODIMENT

The source for generating large area pulsed ion- and electron beams comprises:

A vacuum chamber VC with four high voltage penetrations $F_1$, $F_2$, $F_3$ and $F_4$.

An anode discharge electrode DE with an arrangement of openings which have a radius r, and a center distance D from one another.

In the center of each opening, there is the associated wire electrode NE installed which consists of a material selected so as to generate the desired type of ions. Each of these wire electrodes is connected to the current collector K by way of a series resistor $R_o$. The dielectric plate P which includes bores for the passage of the wire electrodes separates the wire electrodes from the series resistors $R_o$.

At a distance D from the anode discharge electrode DE, an anode grid AG is arranged which, at its circumference includes an anode focusing electrode (AFE) electrically connected to the anode grid. The anode grid AG is connected to the anode discharge electrode DE by way of the resistor $R_{AG}$. The high voltage pulse of the pulse voltage generator (PVG) is conducted to the anode discharge electrode DE by way of the high voltage penetration $F_1$.

A parallel circuit comprising a resistor RW and a capacitor $C_a$ is arranged outside the vacuum chamber VC. This resistor and capacitor combination is connected on one side, by way of the high voltage penetration $F_2$, to the current collector rail K and, on the other side, to the vacuum chamber VC.

To the first cathode grid CG1, a negative grid potential is applied by way of the high voltage penetration $F_3$. The focusing electrode (CFE) extends circumferentially around the first cathode grid CG1. The shape of the cathodes and of the anode focusing electrode are so selected that the beam is guided in an optimal way.

The second cathode grid (CG2) consists of a material which has a high emission coefficient for secondary electrons (for example, nickel). This second grid is grounded by way of a high voltage penetration $F_4$ or a negative grid voltage is applied thereto. This depends on the requirements of the particular system.

If the source is to be used to generate a hydrogen ion beam or an electron beam all the openings in the anode discharge electrode are closed with dielectric plugs having axial bores (see FIG. 2) and consisting of a material with a high hydrogen content (for example, polyethylene). The plugs have a stepped shape with two radii ($r_1 < r_2$). The smaller radius $r_1$ corresponds to the radius of the openings in the anode discharge electrode. The plugs are so inserted into the openings that the parts thereof with the greater radius $r_2$ are disposed adjacent the series resistors $R_o$.

Figure 1:
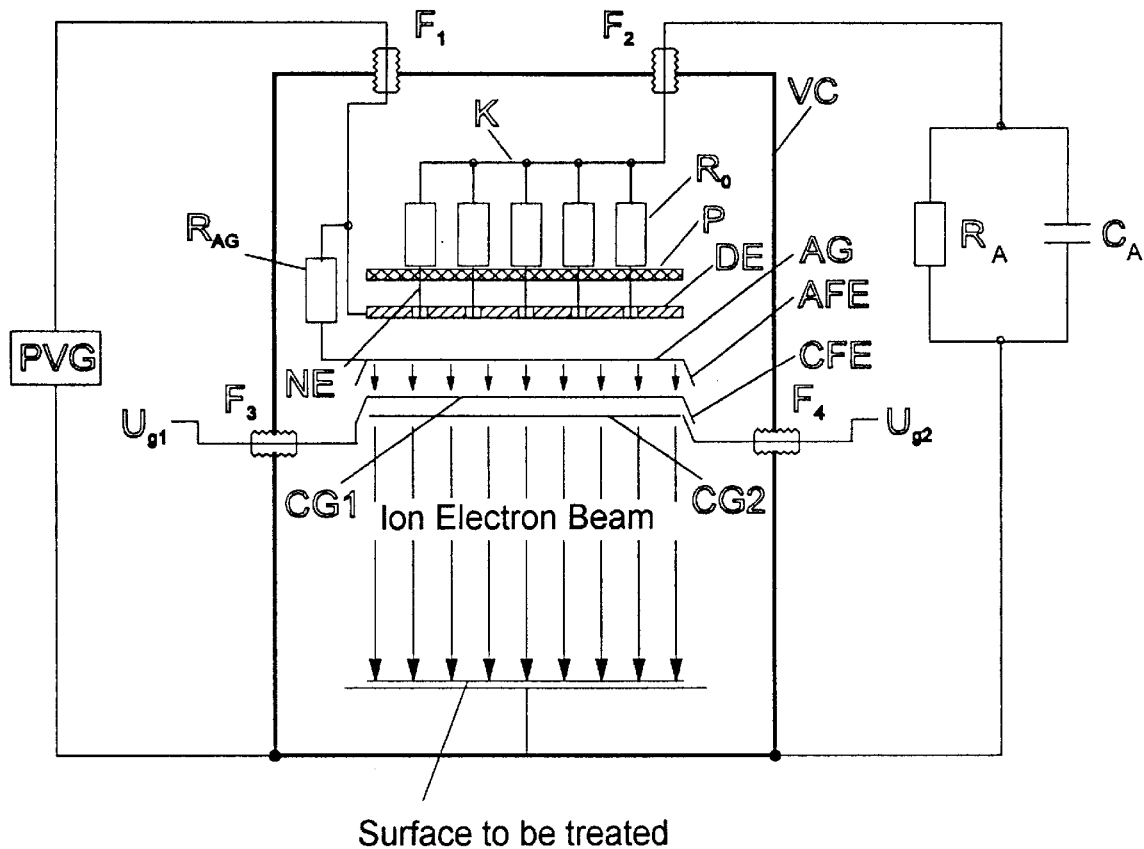
FIG. 1 shows an ion/electron source.
Figure 2:
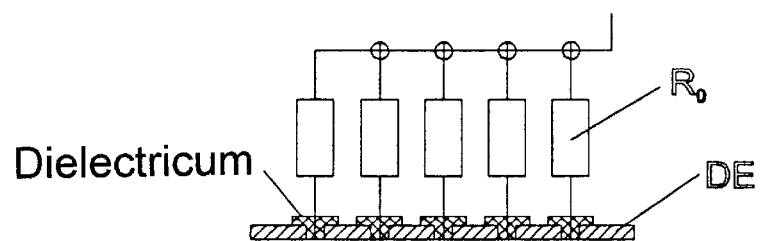
FIG. 2 shows an anode-discharge electrode for hydrogen ion- or electron generation.

The operation of the arrangement will be described on the basis of FIGS. 1 and 2 wherein FIG. 1 shows schematically the source arrangement and FIG. 2 shows the anode discharge electrode for hydrogen and electron generation:

A positive high voltage pulse provided by the pulse voltage generator PVG is supplied to the anode discharge electrode DE. The appearance of the high voltage at the discharge electrode leads to electric discharges between the electrode itself and the wire electrodes installed in the openings in the anode discharge electrode. The purpose of the series resistors $R_o$ in the lines leading to the wire electrodes is to provide for a voltage differential between the discharge electrode and the wire electrodes which is sufficient to sustain a spark in additional discharge gaps even when a significant number of discharges have already occurred. The presence of the resistors and their proper dimensioning guarantees, therefore a homogeneous discharge behavior even for large-area anodes.

For the proper operation of the source the following conditions must be fulfilled:

The radius $r_1$ of the openings in the anode discharge electrodes DE must fulfill the condition:

$$U/[r_1 ln(r_1/r_{NE})] \geq E_b$$

wherein U is the applied anode voltage, $r_{NE}$ is the radius of the wire electrode NE and $E_b$ is the field strength required for the development of the arc discharge. The radius $r_2$ of the dielectric plug must fulfill the condition:

$$U/[r_1 ln(r_2/r_{NE})] < E_b$$

In a particular embodiment $r_2$ was selected to be about 30% greater than $r_1$.

The discharge between the anode discharge electrode DE and the wire electrode NE provides for the generation of a plasma which acts as emitter of ions and electrons and which expands into the space between the anode discharge electrode DE and the anode grid. In order to obtain a homogeneous density of the plasma in the area of the anode grid AG, the distance $\Delta$ between the various wire electrodes NE must be smaller than the distance D between the anode discharge electrode DE and the anode grid AG, that is $\Delta < D$.

When the plasma has reached the openings in the anode grid AG it comes already under the influence of the electric field which has been built up already since the application of the high voltage pulse. The electric field forces extract the charged particles (ions or electrons depending on the type of operation) out of the plasma and accelerate them in the direction toward the cathode grids CG1 and CG2. The particle flux density is determined by the density of the anode plasma.

Experiments have shown that, with the source presented herein, the plasma density is proportional to the total discharge current, that is the sum of all the currents flowing through the various electrodes. The proportionality coefficient is determined experimentally. It has been found to be in the area of 0.05.

Another experimental finding is the increase of the beam flux by 50% as a result of the use of the resistor $R_{AG}$ between the anode grid AG and the anode discharge electrode DE. The resistance value of $R_{AG}$ must fulfill the condition mentioned earlier:

$$R_{AG} >> Te/eI_{io}(1-\alpha)$$

since only in this case, the anode grid AG assumes the floating potential of the anode plasma.

When the ion beam passes through the cathode grid a part of the ions impinges on the grid whereby secondary emission electrons are generated which are required for the compensation of the space charge of the ion beam in the drift space disposed behind the cathode grids. If the two cathode grids CG1 and CG2 are on a negative potential and if the voltage difference between them fulfills the condition:

$$|U_{g1} - U_{g2}| \geq j_i l^2 / (v_i)^{2} \epsilon_o.$$

then most of the secondary electrons generated do not move in the direction of the anode but they move with the ion beam. This provides for a high degree of space charge neutralization and no additional load is created for the pulse voltage generat o r PVG. Herein $j_i$ is the ion flux density, l is the distance between the two cathode grids, $v_i$ is the ion velocity corresponding to the applied anode voltage, and $\epsilon_o$ is the vacuum-dielectric constant. A typical value for the voltage of the first cathode grid CG1 is $-1$ kV.

As a result of the high degree of space charge neutralization the beam can be ballistically focused for example in order to obtain a greater flux density.

Another advantageous result of the potential between the cathode grids is that the inhomogenity of the electric field adjacent the surface of the first cathode grid is reduced and, as a result, the beam divergence can be reduced.

Generation of different types of ions:

Since the wire electrodes for the arc discharges installed in the openings of the anode discharge electrode DE represent the cathodes the plasma generated thereby contains essentially ions of the wire electrode material. Accordingly, the type of ion generated by the source can be changed simply by changing the wire electrodes.

For generating a beam of carbon ions, for example, the wire electrodes are simply replaced by a bundle of carbon fibers.

Generation of a beam composed of several different ions:

For the generation of a beam composed of several different ions, wire electrodes of the particular materials are used. For example the number of carbon fibers or the number of the dielectric plugs are selected in accordance with the desired composition of the beam.

The generation of an electron beam instead of an ion beam requires no mechanical changes, but only two changes in the electrical connections:

- the polarity of the pulse voltage generator PVG must be reversed so that a negative voltage pulse is now applied to the anode, and
- both cathode grids are then electrically connected to the vacuum chamber VC of the source.

What is claimed is:

1. A source for the generation of large area pulsed ion or electron beams, comprising: a vacuum containment, a vacuum arc plasma source with an expansion space and an extraction system disposed in said containment, said arc plasma source consisting of a predetermined arrangement of wire electrodes connected to a current collector rail by way of parallel resistors ($R_o$) and a plate-like anode discharge electrode having an arrangement of openings disposed at a distance ($\Delta$) from each other, each receiving an end of one of said wire electrodes such that said wire electrodes are centered within said openings, an anode grid (AG) disposed at a distance (D) from said anode discharge electrode and being electrically connected, by way of an anode resistor ($R_{AG}$), to said anode discharge electrode such that, under consideration of the limit $$R_{AG} >> Te/eI_{io}(1-\alpha),$$

(Te—electron temperature in the plasma, e=electron elementary charge, $I_{io}$=ion saturation current; $\alpha$=anode grid transparency) said anode grid (AG) assumes the floating potential of an anode plasma generated by said wire electrodes in said anode discharge electrode, said current collector rail being electrically connected, by way of a parallel circuit including a condenser ($C_A$) and a resistor ($R_A$), to said vacuum containment for a secure triggering of the arc discharge between the wire electrodes and the anode discharge electrode and for the control of the ion flux, the dimensioning of the electrical components $R_o$, $R_A$, $C_A$ being subjected to the limitation $$T/[(R_A+R_\Pi)/R_A \times R_\Pi] >> C_A >> T/[(R_A+R_\Pi)/RA \times R_\Pi]$$

wherein $R_\Pi = R_o/n$ and $\Delta < D$ are maintained, (T—duration of the high voltage impulse, $R_A$—external resistor, $R_\Pi$—total wire electrode resistance, T—time period required for the development of the arc discharge, n—number of resistors) a plate disposed between said anode discharge electrode and said parallel resistors, said plate having bores through which said electrode wires extend, and separating the space in which said parallel resistors are arranged from the space in which said anode discharge electrode is arranged, said wire electrodes consisting of materials, and being arranged in said anode discharge electrode with a distribution, corresponding to the desired ion composition of the ion beam to be generated by said source.

2. A source according to claim 1, wherein an anode grid is arranged adjacent said anode discharge electrode and at a predetermined distance therefrom, said anode grid having an anode focusing electrode extending around its circumference and electrically connected to said anode discharge electrode.

3. A source according to claim 2, wherein a first cathode grid is arranged at a predetermined distance from said anode grid and is provided, at its circumference, with a cathode focusing electrode for optimizing the guiding of the beam.

4. A source according to claim 3, wherein a second cathode grid is disposed in beam direction, adjacent said first cathode grid, said second cathode grid having a high emission coefficient for secondary electrons.

5. A source according to claim 4, wherein a voltage supply for said anode discharge electrode and said cathode grids is provided by way of high voltage penetrations through said vacuum containment and said current collector rail is connected to said parallel circuit including said capacitor and said resistor also by way of a high voltage penetration through said vacuum containment.

6. A source according to claim 5, wherein for the generation of hydrogen ions or an electron beam, said openings in said anode discharge electrode are plugged by dielectric plugs having axial bores receiving said electrode wires, said plugs consisting of a material with a high hydrogen content.

* * * * *